(12) United States Patent
Egitto et al.

(10) Patent No.: US 6,905,589 B2
(45) Date of Patent: Jun. 14, 2005

(54) CIRCUITIZED SUBSTRATE AND METHOD OF MAKING SAME

(75) Inventors: Frank D. Egitto, Binghamton, NY (US); Voya P. Markovich, Endwell, NY (US); Thomas R. Miller, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 221 days.

(21) Appl. No.: 10/370,529

(22) Filed: Feb. 24, 2003

(65) Prior Publication Data

US 2004/0163964 A1 Aug. 26, 2004

(51) Int. Cl.[7] ................................................ C25D 5/02
(52) U.S. Cl. ..................................................... 205/125
(58) Field of Search ....................... 205/125; 428/304.4, 428/312.8, 316.6

(56) References Cited

U.S. PATENT DOCUMENTS

| | | |
|---|---|---|
| 5,045,167 A | 9/1991 | Palnik .......................... 204/206 |
| 5,246,817 A | 9/1993 | Shipley, Jr. .................. 430/312 |
| 6,197,182 B1 | 3/2001 | Kaufman et al. ............ 205/159 |
| 6,495,005 B1 | 12/2002 | Colgan et al. ........... 204/224 R |
| 6,506,979 B1 * | 1/2003 | Shelnut et al. ............... 174/255 |
| 2001/0023532 A1 * | 9/2001 | Fujii et al. ...................... 29/830 |
| 2002/0150673 A1 | 10/2002 | Thorn et al. ................... 427/58 |
| 2002/0170827 A1 | 11/2002 | Furuya ........................ 205/131 |
| 2002/0172019 A1 | 11/2002 | Suzuki et al. ................ 361/748 |
| 2002/0190378 A1 | 12/2002 | Hsu et al. .................... 257/745 |
| 2003/0000840 A1 | 1/2003 | Kimura et al. ................. 205/81 |
| 2003/0022013 A1 | 1/2003 | Japp et al. ................... 428/626 |
| 2004/0065960 A1 * | 4/2004 | Egitto et al. ................. 257/774 |

* cited by examiner

*Primary Examiner*—Edna Wong
(74) *Attorney, Agent, or Firm*—Lawrence R. Fraley; Hinman, Howard & Kattell, LLP

(57) ABSTRACT

A method of making a circuitized substrate in which a commoning layer is used to form multiple, substantially vertically aligned conductive openings in a multilayered component such as a laminate interposer for coupling a chip to a printed circuit board or the like. The structure, including such a chip and circuit board is ideally suited for use within an information handling system.

26 Claims, 6 Drawing Sheets

CIRCUITIZED SUBSTRATE AND METHOD OF MAKING SAME

TECHNICAL FIELD

This invention relates to circuitized substrates and particularly multilayered circuit boards and to processes for manufacture of the same. More particularly, the invention relates to new multilayered circuit boards having increased chip and other component attachment capacities and further characterized by increased circuit density.

BACKGROUND OF THE INVENTION

Multilayer circuit boards (MLBs) permit formation of multiple circuits in a minimum volume or space. These typically comprise a stack of layers of signal, ground and/or power planes (lines) separated from each other by a layer of dielectric material. The lines are often in electrical contact with each other by plated holes passing through the dielectric layers. The plated holes are often referred to as "vias".

Known processes for fabricating MLBs typically comprise fabrication of separate innerlayer circuits, which are formed by coating a photosensitive layer or film over a copper layer of a copper clad innerlayer base material. The photosensitive coating is imaged, developed and etched to form conductor lines. After etching, the photosensitive film is stripped from the copper leaving the circuit pattern on the surface of the innerlayer base material.

After formation of individual innerlayer circuits, a multilayer stack is formed by preparing a lay-up of innerlayers, ground planes, power planes, etc., typically separated from each other by a dielectric pre-preg typically comprising a layer of glass cloth impregnated with partially cured material, typically a B-stage epoxy resin. The top and bottom outer layers of the stack comprise copper clad, glass filled, epoxy planar boards with the copper cladding comprising exterior surfaces of the stack. The stack is laminated to form a monolithic structure using heat and pressure to fully cure the B-stage resin. The stack so formed typically has copper cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Conductive vias (or interconnects) are used to electrically connect individual circuit layers within an MLB to each other and to the outer surfaces and typically pass through all or a portion of the stack. Vias are generally formed prior to the formation of circuits on the exterior surfaces by drilling holes through the stack at appropriate locations. Following several pre-treatment steps, the walls of the vias are catalyzed by contact with a plating catalyst and metallized, typically by contact with an electroless or electrolytic copper plating solution to form conductive pathways between circuit layers. Following formation of the vias, exterior circuits, or outerlayers are formed using the procedure described above.

Following MLB construction, chips and other electrical components are mounted at appropriate locations on the exterior circuit layers of the multilayer stack, typically using solder mount pads to bond the components to the MLB. The components are in electrical contact with the circuits within the MLB through the conductive vias. The pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using procedures known to the art such as wave soldering.

Complexity of MLBs has increased significantly over the past few years. For example, boards for mainframe computers may have as many as 36 layers of circuitry or more, with the complete stack having a thickness of about 0.250 inch. These boards are typically designed with three or five mil wide signal lines and twelve mil diameter vias. For increased densification in many of today's MLBs, the industry desires to reduce signal lines to a width of two mils or less and vias to a diameter of two mils or less. Most known commercial procedures, especially those of the nature described hereinabove, are incapable of economically forming the dimensions desired by the industry.

In addition to decreasing line width and via diameter, the industry also desires to avoid manufacturing problems frequently associated with MLB manufacture. As described above, current procedures utilize innerlayer materials that are glass-reinforced resin or other suitable dielectric material layers having a thickness of from about four to five mils clad with copper on both surfaces. The glass reinforcing material is used to contribute strength and rigidity to the MLB stack. However, since lamination is typically at a temperature above 150° C., the resinous portion of the laminate shrinks during cooling to the extent permitted by the rigid copper cladding. If the copper is etched to form a discontinuous pattern, laminate shrinkage may not be restrained by the copper cladding. This problem is exacerbated as feature size decreases. Consequently, further shrinkage may occur. The shrinkage may have an adverse affect on dimensional stability and registration between board layers.

The first step to form a MLB involves lay-up of layers prior to lamination. Care must be exercised to avoid shifting of the innerlayers during lamination. Otherwise, the layers will not be aligned and electrical contact between layers will not be achieved. In addition, during lay-up, air may be trapped in spaces adjacent signal lines because a solid pre-preg is laid over the signal lines that does not completely fill all recesses between signal lines. Care must be taken to evacuate such entrapped air. Residual air pockets can cause defects and subsequent problems during use of the multilayer board.

The use of glass reinforced inner and outerlayer materials creates additional problems. The glass fiber is needed for board strength. However, when holes are drilled to form vias, glass fibers can extend into the holes and, if so, must be removed prior to metallization. Removal creates the need for additional pretreatment steps such as the use of glass etchants to remove glass fibrils extending into the holes. If the glass is not removed, a loss of continuity might occur in the metal deposit. In addition, the glass fibers add weight and thickness to the overall MLB. Materials which do not require reinforced glass fiber (or as much as previous materials) or the like have also been developed to overcome this particular problem.

One improvement in the manufacture of MLBs is disclosed in U.S. Pat. No. 5,246,817. In accordance with the procedures of the '817 patent, manufacture of the MLB comprises sequential formation of layers using photosensitive dielectric coatings and selective metal deposition procedures. In accordance with the process of the patent, the first layer of the board is formed over a temporary or permanent carrier that may become an integral part of the board. When the carrier is a circuit, the process comprises formation of a dielectric coating over the circuit with imaged openings defining the vias. The imaged openings may be obtained by exposure of a photosensitive dielectric coating to activating radiation through a mask in an imaged pattern followed by development to form the imaged openings. Alternatively, imaging may be by laser ablation in which case, the dielectric material need not be photosensitive. Metal is deposited into the recesses within the dielectric coating to form vias. Thereafter, an additional layer of dielectric is coated onto the first dielectric layer, imaged in a pattern of circuit lines, and the recesses are then plated with metal. Alternatively, after imaging the first dielectric coating, it may be coated with a second dielectric coating and imaged and the recesses plated with metal to form the vias and circuit lines simultaneously. By either process, the walls of the imaged opening or recesses in the dielectric coating contain metal as it deposits during plating and assures a desired cross-sectional shape of the deposit. Plating desirably fills the entire recess within the imaged photosensitive coating. The process is repeated sequentially to form sequential layers of circuits and vias.

The method disclosed in this patent include alternative selective metal plating methods whereby metal is selectively deposited within the imaged openings to render the same conductive. The procedures disclosed in the patent involve selectively depositing metal in imaged openings without increase in the surface resistivity of an underlying substrate between conductor lines. Selective metal deposition may be performed by several new techniques disclosed in the patent to avoid increased conductivity between signal lines. The selective deposition procedures of the '817 patent typically involve multiple coating steps using sacrificial layers.

Other examples of methods of making circuitized substrates such as MLBs are described and illustrated in the following documents:

| | |
|---|---|
| 6,506,979 | Shelnut et al |
| U.S. 2002/0150673 | Thorn et al |
| U.S. 2002/0170827 | Furuya |
| U.S. 2002/0172019 | Suzuki et al |
| U.S. 2002/0190378 | Hsu et al |
| U.S. 2003/0022013 | Japp et al |

As described herein, the present invention represents a significant improvement over processes such as those above in the production of circuitized substrates such as MLBs. One particularly significant feature of this invention is the provision of conductive material within the product's vias (openings) using a commoning bar or layer such that two and more consecutive openings can be provided with the necessary conductive material to perform the necessary connective functions required of such vias. Another feature is the provision of such conductive material without the need for a "seed layer" during at least part of the product's formation; such seed layers are often required in many plating operations for MLBs and related products having conductive circuitry as part thereof.

It is believed that such an invention will represent a significant advancement in the art.

OBJECTS AND SUMMARY OF THE INVENTION

It is a primary object of the invention to enhance the art of circuitized substrates.

It is another object to provide a new and unique method of making a circuitized substrate which is adaptable to current manufacturing procedures, yet results in a simplified usage thereof to thereby result in a product of reduced cost.

According to one aspect of the invention, there is provided a method of making a circuitized substrate wherein the method comprises providing a first dielectric layer, securing a first conductive layer to said first dielectric layer, forming at least one first opening within the dielectric layer, the at least one opening extending through the entire thickness of the dielectric layer, electroplating a first quantity of conductive material within the at least one opening using the conductive layer as a commoning layer for the electroplating, securing a second dielectric layer to the first dielectric layer, providing at least one second opening within the second dielectric layer in substantial alignment with the at least one first opening in the first dielectric layer, and electroplating a second quantity of conductive material within the at least one second opening, again using the first conductive layer as a commoning layer for the electroplating of the second quantity of conductive material. Subsequent vertically aligned conductive openings (vias) can then be formed, using the same commoning layer.

According to another aspect of the invention, there is provided a circuitized substrate made using the aforementioned teachings.

According to yet another aspect of the invention, there is provided an information handling system including as part thereof a circuitized substrate made in accordance with the teachings herein.

All of the above FIGS. are side elevational views, taken in section. Some are obviously of larger scale, for illustration purposes.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include a substrate which includes at least one dielectric layer having an opening therein and some conductive material included therein adapted for providing electrical coupling through the opening to various elements, e.g., signal pads or lines, electronic components, e.g., chip-containing modules, resistors, capacitors, etc. One example of such a substrate is a printed circuit board of many layers, referred earlier herein as a MLB. This is not meant to limit the invention, however, because these teachings could also be used to produce other examples, including modules where the dielectric material is ceramic, etc.

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "electroplating" as used herein is meant a plating process in which a metallic coating (layer) or similar quantity of metallic material is deposited onto a conductive material placed in an electrolytic bath composed of a solution of the salt of the metal to be plated.

Figure 1:
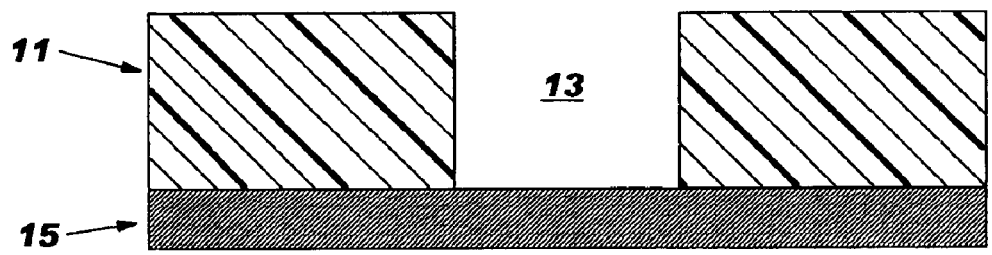
FIGS. 1–4 represent the basic steps of forming a circuitized substrate in accordance with one aspect of the present invention.

In FIGS. 1–4, there are shown the basic steps of forming a conductive opening within a circuitized substrate in accordance with one aspect of the present invention. In FIG. 1, a dielectric layer 11 is provided having at least one opening 13 therein. In a preferred embodiment, dielectric layer 11 is comprised of a fiberglass-reinforced epoxy resin. Other materials suitable for use for layer 11 include polytetrafluoroethylene (Teflon), polyimides, polyamides, cyanate resins, photoimageable materials, ceramic and other materials. If the dielectric material is a photoimageable material, it is photoimaged and photopatterned and developed to provide opening 13 therein. Such a dielectric material may be curtain coated or screen applied or it may be applied as a dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition.

In a preferred embodiment, dielectric layer 11 includes a thickness of from about 1 mil to about 4 mils. Opening 13 is preferably provided using laser ablation, a procedure known in printed circuit board technology. The structure of FIG. 1 also includes a conductive layer 15 secured to dielectric layer 11 such that it extends across opening 13. In a preferred embodiment, layer 15 is copper and has a thickness of from about 0.1 mil to about 1.4 mils. The preferred method of securing dielectric 11 and conductive layer 15 is lamination, using known temperatures and pressures. It is also understood that layer 15 could be part of a copper carrier sheet of which the carrier sheet is provided for temporary support and can be removed later in the process.

Although only one opening 13 is shown in dielectric layer 11, it is understood that several such openings are possible (and most likely) if the final product formed herein is to be an MLB or the like structure in order to assure the desired operational requirements thereof, particularly the circuit densities commanded in such products today. One example of such a product is described in detail below.

Figure 2:
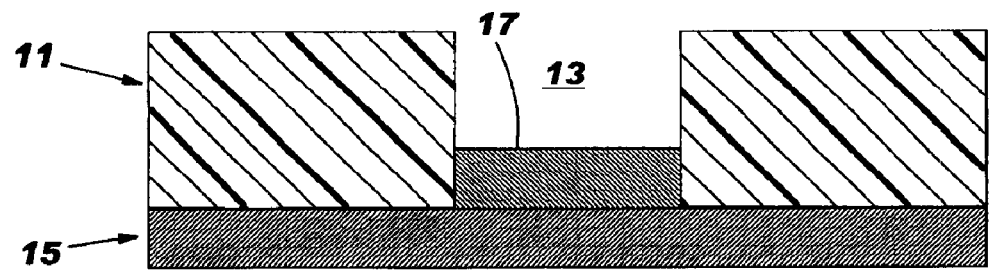
Figure 3:
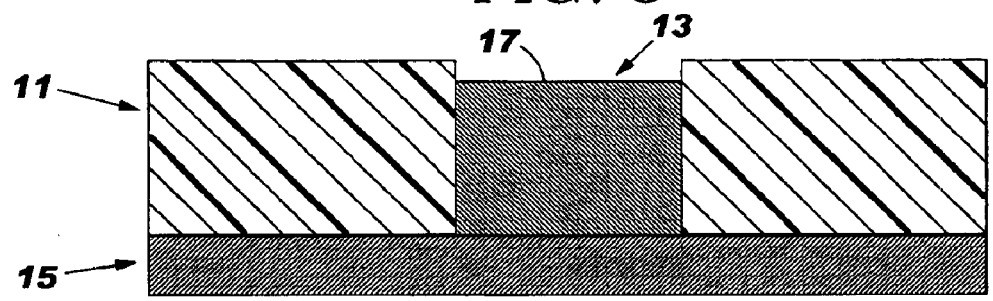

In FIG. 2, a quantity of conductive material 17 is shown as being provided within opening 13. In a preferred embodiment of the invention, conductive material 17 is copper and is added within opening 13 using an electroplating process. Significantly, as part of this process, the conductive layer 15 serves as a commoning layer for same such that several openings within dielectric layer 11 may be similarly filled to a desired depth using this process. This represents a significant aspect of the invention because such an electroplating procedure (here, electrolytic) eliminates the need for a seed or similar layer as is often required in plating operations using dielectric materials in the manner defined herein. In FIG. 3, conductive material 17 is at its final height within opening 13 following completion of the electrolytic plating.

The aforementioned electrolytic plating procedure involves the placement of the structure shown in FIG. 1 within a plating bath and the appropriate electrical connection made to the commoning layer (15). In a preferred embodiment of the invention, the bath comprised a composition of copper and copper salts and a source for copper ions, generally copper bars or balls and vendor proprietary chemicals for maintaining brightness and enhancing the leveling properties of the deposited copper. Alternative compositions may also be used, another example being a composition including copper, a source of copper ions from copper salts, a reducing agent and a chelating agent.

The resulting structure, as shown in FIG. 3, provides a quantity of copper material 17 at a precise depth within opening 13 for each of the openings in the substrate. Again, the use of commoning layer 15 assures this result.

Figure 4:
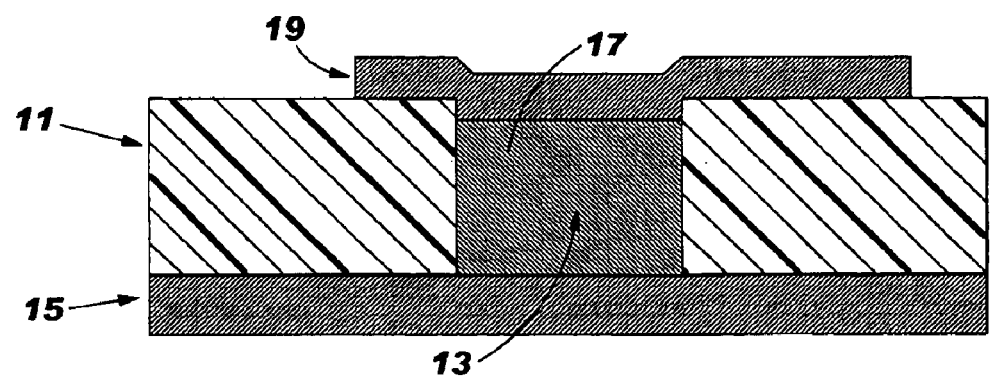

In FIG. 4, a second conductive layer 19 is provided atop the upper surface of conductive material 17 and along a portion of the top surface of layer 11. In a preferred embodiment, conductive layer 19 is provided using conventional photolithographic procedures known in the MLB art, such procedures involving the use of an initial plated layer covering substantially the entire upper surface of dielectric 11, following which photolithographic procedures (e.g., masking) are used, following which an etchant is applied to remove conductive material and produce the desired resulting pattern. However, it is understood that the pattern can be formed by pattern plating. In FIG. 4, this second conductive layer 19 extends outwardly (e.g., to the right) so as to eventually connect to another conductive line or pad which forms part of the eventual circuitry on layer 11 for this first part of such an MLB, if an MLB is the desired end product. The preferred conductive material plated within opening 13, as stated, is copper but may also be a copper alloy or other conductive material, e.g., nickel, aluminum, etc. The invention is thus not limited to simply copper.

The resulting thickness for the structure of FIG. 4, in one embodiment of the invention, including layers 11, 15 and 19, is from about 3 mils to about 10 mils.

Figure 5:
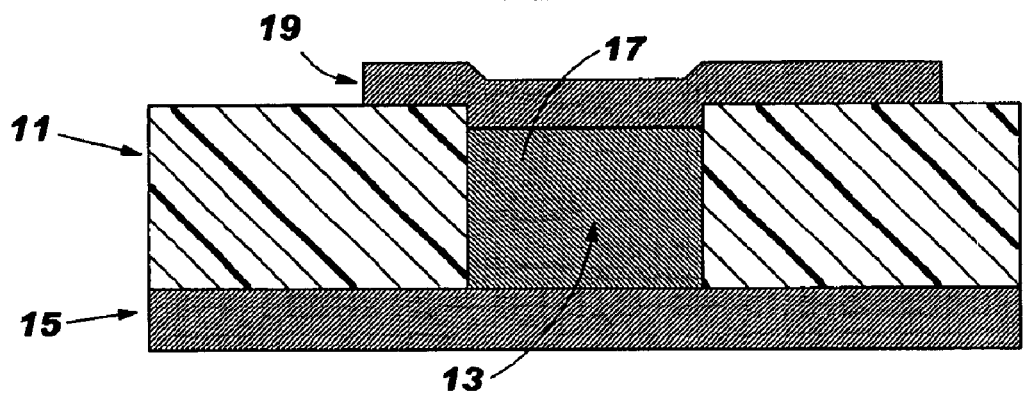
FIGS. 5–7 illustrate the various depths that electrically conductive material can be deposited within the opening of a dielectric layer of the circuitized substrate of the invention.
Figure 6:
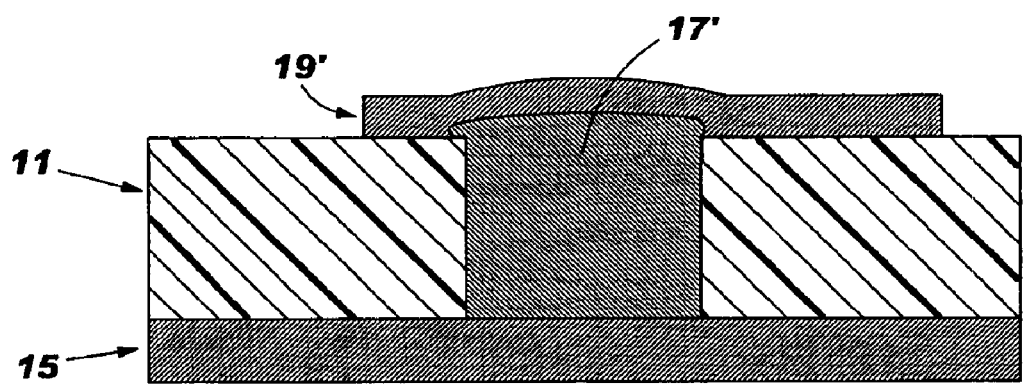
Figure 7:
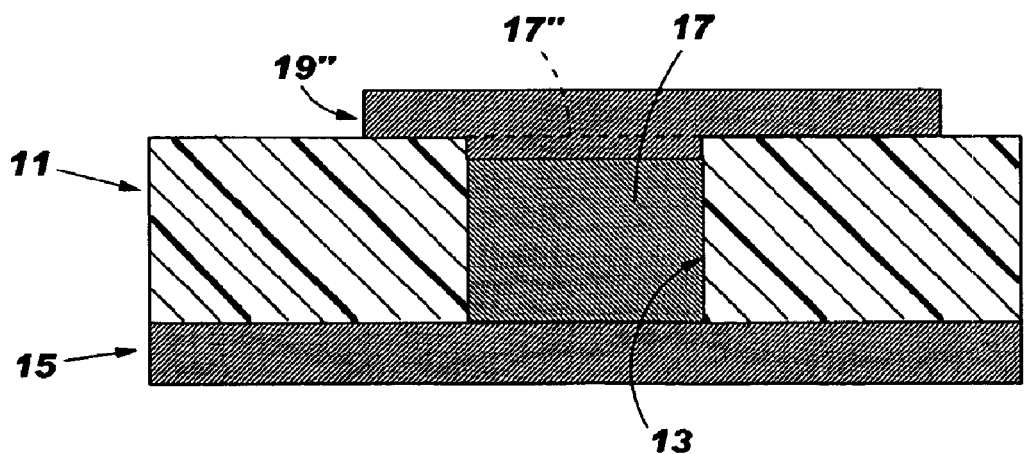

FIGS. 5–7 are examples of structures built using the aforedescribed process, FIG. 5 illustrating a depth of conductive material 17 similar to that in FIG. 4. FIGS. 6 and 7 illustrate that it is also possible using the teachings of the present invention to plate conductive material 17' above the substantially planar upper surface of dielectric layer 11, while still providing an acceptable work product. The resulting circuit (conductive) layer 19' will substantially follow the protruding upper surface of conductive material 17' and still form the desired circuit, or it may be mechanically or chemically ground to a planar upper surface.

It is seen in FIG. 5 that quantity of conductive material 17 does not completely fill opening 13 and that the conductive layer 19 formed there-over thus includes an indentation therein. The subsequently provided second quantity of conductive material will be formed on this indentation, as shown below in FIG. 9. It is seen in FIG. 6 that the quantity of conductive material 17' overfills opening 13 and thus extends above the upper surface of the first dielectric layer 11. As a result, the second conductive layer 19' includes a domed (or rounded) portion over opening 13. Understandably, when the second dielectric layer and second opening are formed, as occurred with the formation shown in FIGS. 8–10, the second quantity of conductive material will be formed on this domed portion.

FIG. 7 represents an alternative embodiment wherein it is desired that the upper circuit (conductive) layer 19" have a substantially planar upper surface. Such planarity can be obtained by a mechanical grinding or the like process once the upper conductive layer 19" has been plated using the procedures described above, if material 17 is to the level shown in FIG. 5. Preferably, the conductive material in opening 13 in the embodiment depicted in FIG. 7 is plated to a level coplanar with the upper surface of dielectric layer 11 (thus shown as material 17") such that the resulting plated circuit layer 19" will be of a substantially planar configuration as shown and further work thereon, such as the aforedescribed mechanical grinding, is not necessary.

Figure 8:
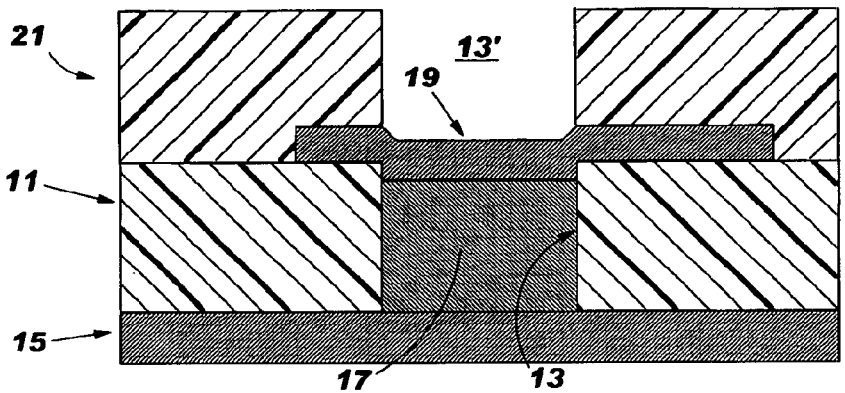
FIG. 8 illustrates a step of adding a second dielectric layer to the structure formed in FIG. 4 and forming a second via in said second dielectric layer.

In FIG. 8, a second dielectric layer 21 is added by a lamination process, preferably of the same material as layer 1. Dielectric layer 21 includes an opening 13' therein which, as shown, is aligned substantially directly above lower opening 13. Opening 13' is preferably also laser ablated.

Figure 9:
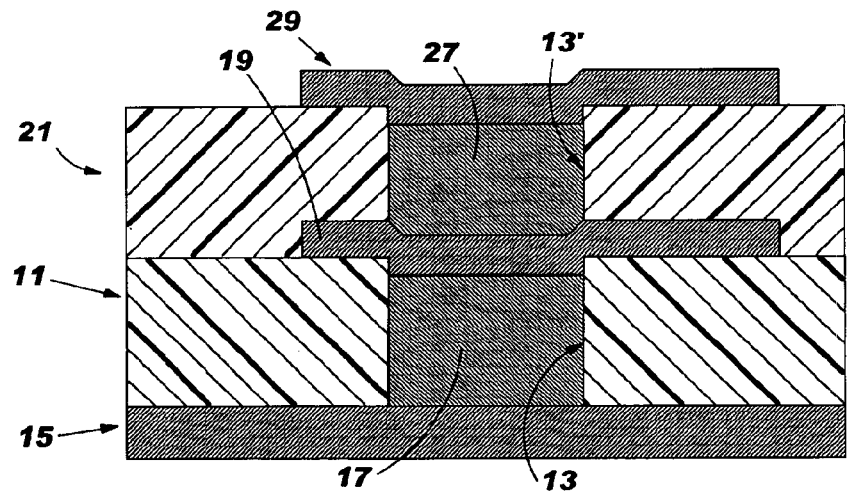
FIG. 9 illustrates the provision of conductive material and the addition of a layer of conductive material into the opening of the second dielectric layer and onto the layer's upper surface, respectively, of the embodiment of FIG. 8.

In FIG. 9, a second conductive (circuit) layer 29 is added following an earlier provision of another quantity of conductive material 27 within the opening 13'. Significantly, the second quantity of conductive material 27 is similar to that of material 17 and is provided using electrolytic plating. Of greater significance, the commoning layer 15 provides the connection to achieve this electroplating and assures a precise depth of the second conductive material 27 within the second opening 13'. This represents a significant aspect of the invention because it does not require the provision of a second commoning or other conductive layer in order to properly provide the desired conductive material within the second opening. It is also understood that using the unique teachings of the instant invention, several aligned conductive openings, each including its own circuit pattern (19 or 29) can be provided, depending on the number of desired layers for the final product using these teachings. Again, an example is described hereinbelow.

Figure 10:
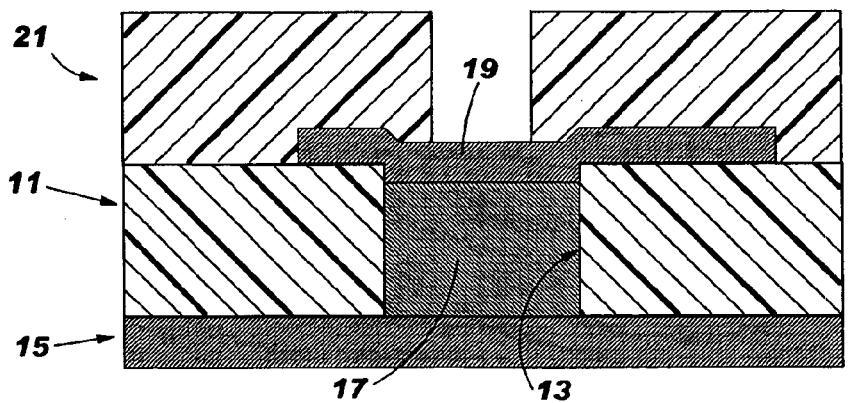
FIG. 10 illustrates the relatively small opening that can be provided within the second dielectric layer of the invention using the teachings herein.

FIG. 10 is provided to illustrate that the invention is adaptable to providing smaller second openings within the second dielectric layer 21, e.g., using laser ablation, to thus provide the unique capability of using less quantities of plated conductive material (i.e., 27 in FIG. 9) if desired. This can represent a significant cost advantage for the resulting end structure. The embodiment in FIG. 10 will thus have conductive material plated within the smaller opening and another circuit layer provided thereover as was accomplished in FIG. 9. And, once again, additional dielectric layers and aligned conductive openings can be provided above the structure, depending on the desired layers for the final product.

Figure 11:
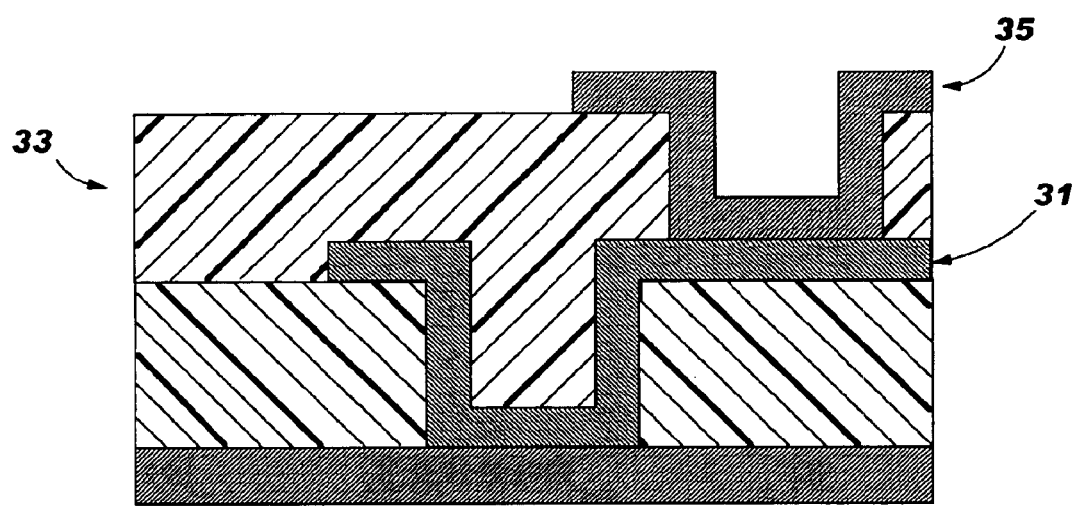
FIG. 11 shows the relative positioning of offset conductive vias typically found in some known circuitized substrates.

The embodiment of FIG. 11 represents a process in which a dielectric layer is provided similar to layer 11 and the aforementioned photolithographic plating procedure used to provide a circuit pattern 31 thereon. A second dielectric layer 33 is then added and another circuit layer 35 provided as shown. Layer 35 connects to layer 31 in an offset orientation, as shown. This embodiment, requiring photolithographic processing, typically requires the use of a "seed layer" on the dielectric and thus the use of additional materials and processing over the unique method as taught hereinabove. This process as shown in FIG. 11 has also proven difficult to directly align conductive openings in a vertical orientation, thus necessitating the utilization of additional dielectric real estate for the combined structure. This unnecessary requirement is overcome by the unique teachings herein.

Figure 12:
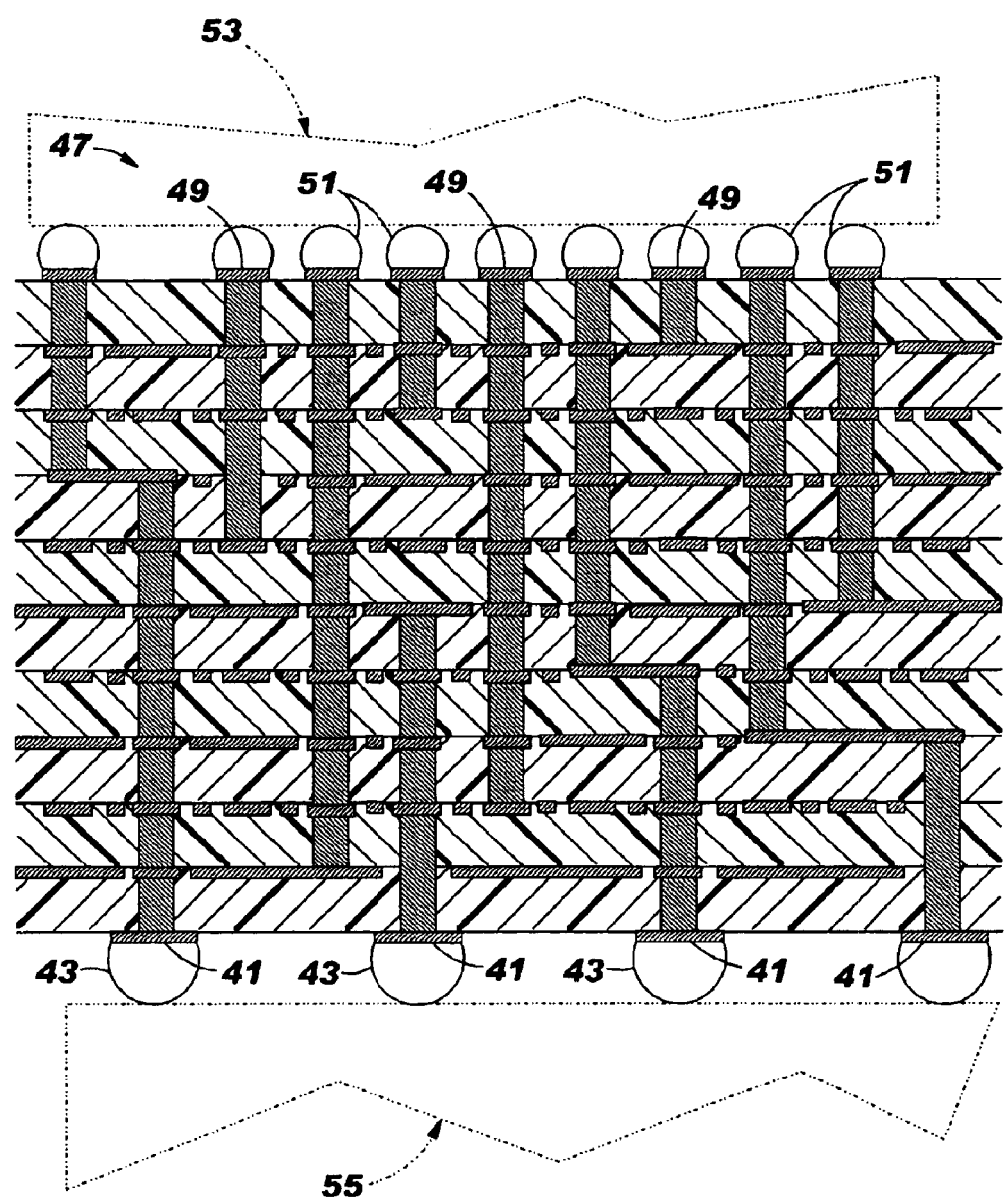
FIG. 12 represents an electronic package, including a circuitized substrate of the present invention.

In FIG. 12 there is shown one example of a multilayered structure which can be produced using the new and unique teachings of the instant invention. It is understood that in this structure, the commoning layer (15, above) has been removed (e.g., mechanically peeled away) following the formation of the desired number of vertically oriented conductive openings within the desired number of dielectric layers (ten shown in FIG. 12). Although layer 15 may be entirely removed, it is also within the scope of the invention to selectively remove only portions thereof so as to provide desired pads (41) for eventual coupling to another electrical feature, one such example being a solder ball 43. In another embodiment, layer 15, if provided on the opposite (upper) dielectric layer of this structure (now referred to as numeral 47) could also be selectively removed to provide a plurality of other pads 49 which also are adapted for being electrically coupled to another electrical feature, in the example shown herein, another plurality of solder balls 51.

Structure 47, as provided, thus provides electrical coupling between a first electronic component 53 or the like (shown in phantom in FIG. 12) and another circuitized component 55 (below). In one example, component 53 may be a semiconductor chip having conductive pads (not shown) on the bottom surface thereof which are in turn electrically coupled to the solder balls 51.

Structure 47 is also designed for being electrically coupled to an underlying substrate or the like, including a much larger MLB 55 (shown in phantom in FIG. 12) such that the larger solder balls 43 are located on respective contact pads or the like circuitry (not shown) typically formed on such MLBs. An alternative name for structure 47 can thus be a laminate interposer for coupling two opposed components. This structure, when including the upper component such as chip 53, can also be referred to in the industry as a module or the like and, if including the larger solder balls 43 on the bottom thereof, a ball grid array (BOA) module. Modules of this type are made and sold by the assignee of the instant invention. The final structure, including such a module and the circuit board (i.e., 55) on which it is positioned can then be positioned within and form part of a computer, server, or other product defined above as being an "information handling system".

In FIG. 12, it is seen that several vertically aligned conductive openings are possible, including to different established depths within the overall thickness of the interim structure 47. It is, of course, also possible to provide these openings such that same extend entirely through the thickness of structure 47, thus forming what might be referred to in the art as a "plated through hole" (actually a series of plated holes in vertical alignment), but not one of the traditional type in which a drill is used to drill entirely through the structure and a subsequent plating operation performed to provide the desired conductive material on the through hole which would then hopefully connect to interim conductive layers through which the hole extended, such as described in aforementioned U.S. Pat. No. 5,246,817. The invention as provided represents a more reliable means of providing such connections while increasing the circuit density in the final product.

Figure 13:
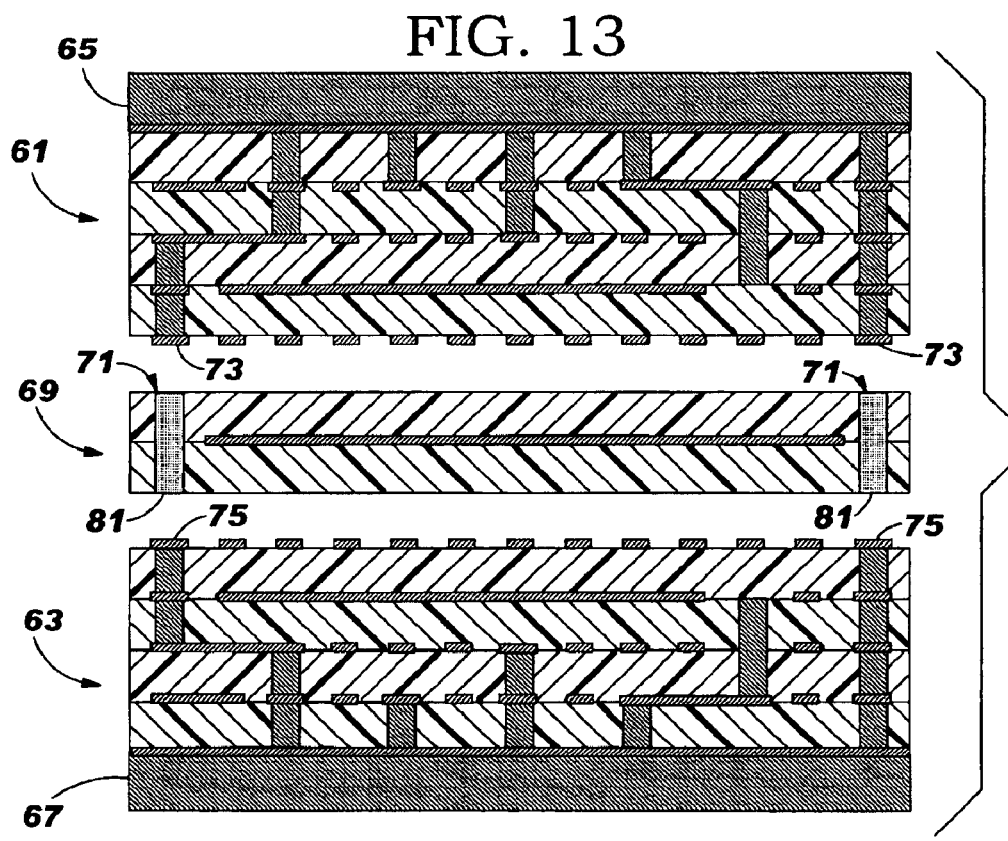
FIG. 13 is an exploded view illustrating an alternative embodiment of making a multilayered circuitized substrate in accordance with one embodiment of the invention.
Figure 14:
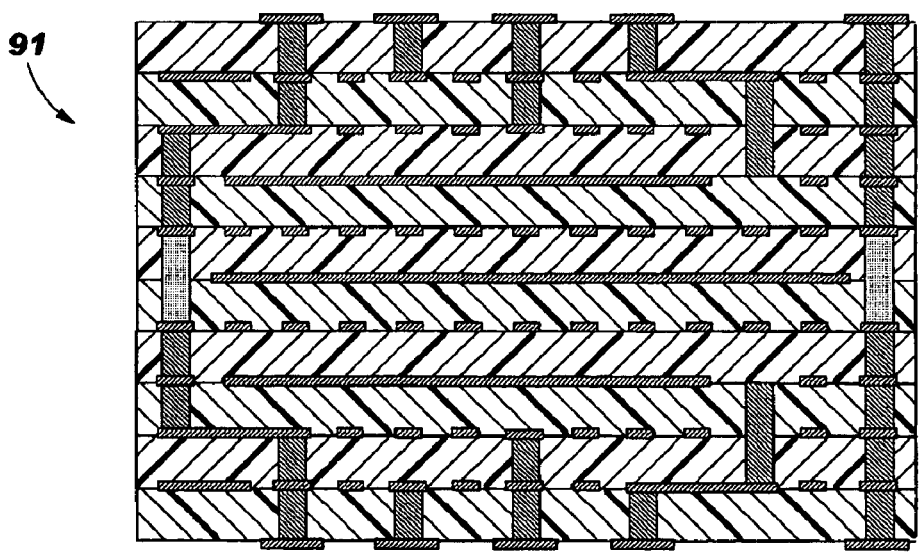
FIG. 14 represents the structure formed using the elements of FIG. 13.

FIGS. 13 and 14 represent the formation of a multilayered structure using the teachings of the present invention in a somewhat different manner than for providing structure 47 in FIG. 12. In FIG. 13, a pair of multilayered subassemblies 61 and 63 are provided, each using a commoning layer 65 and 67, respectively, formed by utilization of the aforedefined teachings. The structures 61 and 63, with the commoning layers in place, are then laminated together, preferably utilizing an interposer structure 69 as shown. Interposer 69 preferably includes at least one dielectric layer and a plurality of openings 71 for providing connection between desired pairs of conductive pads 73 and 75 of the respective structures. In this embodiment, each opening 71 includes an electrically conductive paste 81. By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. DuPont deNemours under the trade designation CB-100, Ablebond 8175 from the Ablestik Company and filled polymeric systems, thermoset or thermoplastic type, containing transient liquid conductive particles or other metal particles such as gold, tin, palladium, copper, alloys, and combinations thereof. One particular example is coated copper paste. Metal coated polymeric particles disposed in a polymeric matrix can also be used.

The structure of FIG. 13 is laminated using temperatures and pressures known in the art for forming multilayered circuit boards and dependent upon the material set chosen for the dielectric. In the case of the structure of FIG. 13, a desired temperature range of from about 150° C. to about 375° C. and pressure range of about 300 psi to about 2,200 psi may be used.

FIG. 14 represents the final structure 91 formed as a result of this lamination, with the respective commoning layers 65 and 67 removed entirely or selectively as described above. Structure 91 may then be used as an interposer such as structure 47 in FIG. 12.

Thus there has been shown and described a new and unique method of making a circuitized substrate which will provide greater circuit densities and other operational characteristics better than those of many known multilayered structures. The method utilizes technology in various forms as known in the art and thus can be produced at relatively less cost than many known, similarly complex structures. Although the structures shown herein include ten dielectric layers and respective conductive layers therebetween, the invention is capable of providing finalized multilayered structures possessing more or less than these with as many layers needed to achieve the final thickness, e.g., as many as about 50 such layers may be possible. Further, although solder balls are shown to provide the necessary connections between the components which the invention is able to couple, this is also not meant to limit the invention because other means of connection are readily possible. For example, the upper surface of structure 47 in FIG. 12 could be coupled to a lead component wherein individual metallic leads form connections with the respective pads 49. The same is true for pads 41 on the undersurface of structure 47.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:
   providing a first dielectric layer;
   securing a first conductive layer to said first dielectric layer;
   forming at least one first opening within said first dielectric layer, said at least one opening extending through the entire thickness of said first dielectric layer;
   electroplating a first quantity of conductive material within said at least one first opening using said first conductive layer as a commoning layer for said electroplating so as to not completely fill said at least one first opening;
   forming a second conductive layer on said first dielectric layer and over said at least one first opening within said first dielectric layer in contact with said first quantity of conductive material within said at least one first opening such that said second conductive layer will have an indentation therein;
   securing a second dielectric layer to said first dielectric layer;
   providing at least one second opening within said second dielectric layer in substantial alignment with said at least one first opening in said first dielectric layer; and
   electroplating a second quantity of conductive material within said at least one second opening in contact with said indentation within said second conductive layer, again using said first conductive layer as a commoning layer for said electroplating of said second quantity of conductive material.

2. The method of claim 1 wherein said securing said first conductive layer to said first dielectric layer is achieved by lamination.

3. The method of claim 1 wherein said electroplating of said first quantity of conductive material is achieved using electrolytic plating.

4. The method of claim 3 wherein said first quantity of conductive material is copper or a copper alloy.

5. The method of claim 1 wherein said second conductive layer is provided using photolithographic processing.

6. The method of claim 1 wherein said second conductive layer forms a circuit pattern on said first quantity of conductive material and said first dielectric layer.

7. The method of claim 1 wherein said second dielectric layer is secured to said first dielectric layer and over at least a portion of said second conductive layer using lamination.

8. The method of claim 1 further including removing at least a portion of said first conductive layer secured to said first dielectric layer.

9. The method of claim 1 wherein said second dielectric layer is secured to said first dielectric layer using lamination.

10. The method of claim 1 further including adding additional layers of dielectric material atop said second dielectric layer and providing at least one opening in each of said additional layers all in substantial alignment with said at least one second opening in said second dielectric layer and electroplating a quantity of conductive material in each of said at least one openings in said additional layers of dielectric material, again using said first conductive layer as a commoning layer for said electroplating of each of said quantities of conductive material.

11. The method of claim 10 further including removing at least a portion of said first conductive layer following the last electroplating of said quantities of conductive material.

12. The method of claim 11 wherein portions of said first conductive layer remain following said removing, selected ones of said portions comprising conductive pads.

13. The method of claim 1 further comprising aligning said circuitized substrate formed by said method with a second circuitized substrate also formed by said method with an interim interposer and bonding both said circuitized substrates and said interim interposer to form a multilayered circuitized substrate.

14. A method of making a circuitized substrate, said method comprising:

providing a first dielectric layer;

securing a first conductive layer to said first dielectric layer;

forming at least one first opening within said first dielectric layer, said at least one opening extending through the entire thickness of said first dielectric layer;

electroplating a first quantity of conductive material within said at least one first opening using said first conductive layer as a commoning layer for said electroplating so as to overfill said at least one first opening;

forming a second conductive layer on said first dielectric layer and over said at least one first opening within said first dielectric layer in contact with said first quantity of conductive material within said at least one first opening such that said second conductive layer will have a substantially domed portion thereon;

securing a second dielectric layer to said first dielectric layer;

providing at least one second opening within said second dielectric layer in substantial alignment with said at least one first opening in said first dielectric layer; and electroplating a second quantity of conductive material within said at least one second opening in contact with said substantially domed portion of said second conductive layer, again using said first conductive layer as a commoning layer for said electroplating of said second quantity of conductive material.

15. The method of claim 14 wherein said securing said first conductive layer to said first dielectric layer is achieved by lamination.

16. The method of claim 14 wherein said electroplating of said first quantity of conductive material is achieved using electrolytic plating.

17. The method of claim 16 wherein said first quantity of conductive material is copper or a copper alloy.

18. The method of claim 14 wherein said second conductive layer is provided using photolithographic processing.

19. The method of claim 14 wherein said second conductive layer forms a circuit pattern on said first quantity of conductive material and said first dielectric layer.

20. The method of claim 14 wherein said second dielectric layer is secured to said first dielectric layer and over at least a portion of said second conductive layer using lamination.

21. The method of claim 14 further including removing at least a portion of said first conductive layer secured to said first dielectric layer.

22. The method of claim 14 wherein said second dielectric layer is secured to said first dielectric layer using lamination.

23. The method of claim 14 further including adding additional layers of dielectric material atop said second dielectric layer and providing at least one opening in each of said additional layers all in substantial alignment with said at least one second opening in said second dielectric layer and electroplating a quantity of conductive material in each of said at least one openings in said additional layers of dielectric material, again using said first conductive layer as a commoning layer for said electroplating of each of said quantities of conductive material.

24. The method of claim 23 further including removing at least a portion of said first conductive layer following the last electroplating of said quantities of conductive material.

25. The method of claim 24 wherein portions of said first conductive layer remain following said removing, selected ones of said portions comprising conductive pads.

26. The method of claim 14 further comprising aligning said circuitized substrate formed by said method with a second circuitized substrate also formed by said method with an interim interposer and bonding both said circuitized substrates and said interim interposer to form a multilayered circuitized substrate.

* * * * *